United States Patent [19]

Chalco et al.

[11] Patent Number: 5,079,070

[45] Date of Patent: Jan. 7, 1992

[54] REPAIR OF OPEN DEFECTS IN THIN FILM CONDUCTORS

[75] Inventors: Pedro A. Chalco, Yorktown Heights; Carlos J. Sambucetti, Croton-on-Hudson, both of N.Y.

[73] Assignee: International Business Machines Corporation, Armonk, N.Y.

[21] Appl. No.: 595,902

[22] Filed: Oct. 11, 1990

[51] Int. Cl.$^5$ ................................................ B32B 9/00
[52] U.S. Cl. ............................ 428/209; 428/426; 428/433; 428/446; 428/457; 428/473.5; 428/901; 428/913; 427/57; 156/233
[58] Field of Search .......... 427/57; 156/233; 428/209, 901, 473.5, 457, 446, 913, 426, 433

[56] References Cited

U.S. PATENT DOCUMENTS

| | | | |
|---|---|---|---|
| 3,576,551 | 4/1971 | Gange | 505/834 |
| 4,383,164 | 5/1983 | Eto | 219/121 |
| 4,636,403 | 1/1987 | Fisanick et al. | 427/53.1 |
| 4,704,304 | 11/1987 | Amendola et al. | 427/57 |
| 4,778,097 | 10/1988 | Hauser | 228/44.7 |
| 4,814,855 | 3/1989 | Hodgson et al. | 174/52.4 |

FOREIGN PATENT DOCUMENTS 0366259 5/1990 European Pat. Off. .

OTHER PUBLICATIONS

Research Disclosure, Anonymous, 3/86, p. 144, #26339, Deposition of Sandwich Metallurgy.

Primary Examiner—Patrick J. Ryan
Attorney, Agent, or Firm—Philip J. Feig

[57] ABSTRACT

Open defects in thin film conductor lines on a substrate are repaired by diffusion bonding a selected conductive repair line from a support sheet positioned over the open defect. The diffusion bonding is performed by the application of ultrasonic energy and laser energy.

21 Claims, 2 Drawing Sheets

REPAIR OF OPEN DEFECTS IN THIN FILM CONDUCTORS

BACKGROUND OF THE INVENTION

The present invention relates to a method of repairing open defects in thin film conductor lines on a substrate, such as a printed circuit board or a multi-layered ceramic substrate, by diffusion bonding a conductive metal line from a support sheet to the open defect region of the conductor. Specifically, a pattern of conductive lines is formed onto a support sheet from which one line is selectively bonded in position to repair an open defect in a conductor line by the use of a combination of laser energy and ultrasonic energy.

The manufacturing of very fine circuit conductors in a substrate such as a high density printed circuit board or a multi-layer ceramic substrate is characterized by defects which are inevitably produced. One prior method of repairing opens in conductors relies upon filling the gap with copper deposited by decomposition of an organo-metallic gas induced by laser chemical vapor deposition. The method has serious deficiencies resulting from the use of cold metal deposition which inhibits the formation of a sound metallurgical bond. Another problem encountered with the prior method is the poor mechanical reliability of the repair segment which is manifest by delamination during spin cleaning or thermal cycling of the substrate. The prior method also requires an additional processing step in order to remove any thin contamination or metallic film such as a chromium layer often found on the surface of circuit lines, thereby extending the time required to effect the repair.

U.S. Pat. No. 4,704,304 describes a repair method in which an unpatterned repair metal film is placed over a general area of an open defect in a conductive line on a substrate. The resultant assembly is heated to cause diffusion bonding between the repair metal and conductive lines. The repair area is then subjected to ultrasonic energy while being disposed in a liquid in order to remove metal bridges between conductors without removing repair metal bridges over opens in the conductive lines.

U.S. Pat. No. 4,636,403 describes a photomask repair method in which a surface is coated with a layer of metal-organic compound which is exposed to a laser beam in the region of a defect until a patch is formed. After the patch is formed excess unexposed compound remaining on the substrate surface is removed with an appropriate solvent.

SUMMARY OF THE INVENTION

In contrast, the present invention provides an improvement over the prior art repair techniques by aligning a selected conductive repair line from a pattern of such lines located on a support sheet at the location of the open defect and bonding the selected line only over the open defect in the conductor to be repaired. In this manner, the step of removing unwanted metal from the substrate is eliminated, thereby providing for a speedier, less expensive method of repairing an open defect in a conductor.

Briefly, the preferred method of practicing the present invention comprises positioning a conductive line segment over an open defect in a circuit conductor. The segment is selected from a grid of conductive repair lines preferably formed by conventional circuitization such as by substractive etching, laminating, plating or the like of a metal blanket film onto a support sheet. The repair lines themselves are exposed through window openings etched, ablated or otherwise formed in the support sheet. The line segment is bonded to cover the ends of the open conductor by the simultaneous application of a combination of ultrasonic and laser energy. Wire bonding using a combination of ultrasonic energy and laser energy is described, for example, in pending patent application Ser. No. 07/489,838 and assigned to the same as assignee as the present invention, which allowed application is incorporated herein by reference.

The conductive repair lines are formed of a metal which exhibits good electrical conductivity properties and an absence of corrosion, and which is readily fabricated on a support sheet. The preferred metal is gold-plated copper. However, the conductive repair lines can also be a noble metal such as gold, copper, gold-plated-copper or even a combination of metals, such as gold-tin, that forms an eutectic alloy.

The support sheet material is selected for ease of metallization and etching of the metal forming the repair line. The support sheet is preferably polyimide or Kapton. However, Mylar, Teflon or even a metal, such as Ni metal, can be used as the support sheet material. Moreover, a photosensitive polymer or epoxy can act as the transfer sheet. The transfer sheet is blanket metallized by sputtered Cr/Cu, then circuitized by photo processes and etching procedures. The support sheet provides mechanical support to the repair line or wire prior to and during the bonding process.

A principal object of the present invention is therefore, the provision of a method of repairing an open defect in a line conductor on a substrate.

A further object of the present invention is the provision of a method of repairing an open conductor on a substrate by bonding a conductive repair line from a pattern of repair lines supported by a support sheet by means of the simultaneous application of a combination of ultrasonic energy and laser energy.

Another object of the invention is the provision of a support sheet useful in the repair of an open defect in a line conductor on a substrate.

Further and still other objects of the present invention will become more clearly apparent when the following description is read in conjunction with the accompanying drawings.

DETAILED DESCRIPTION

Figure 1:
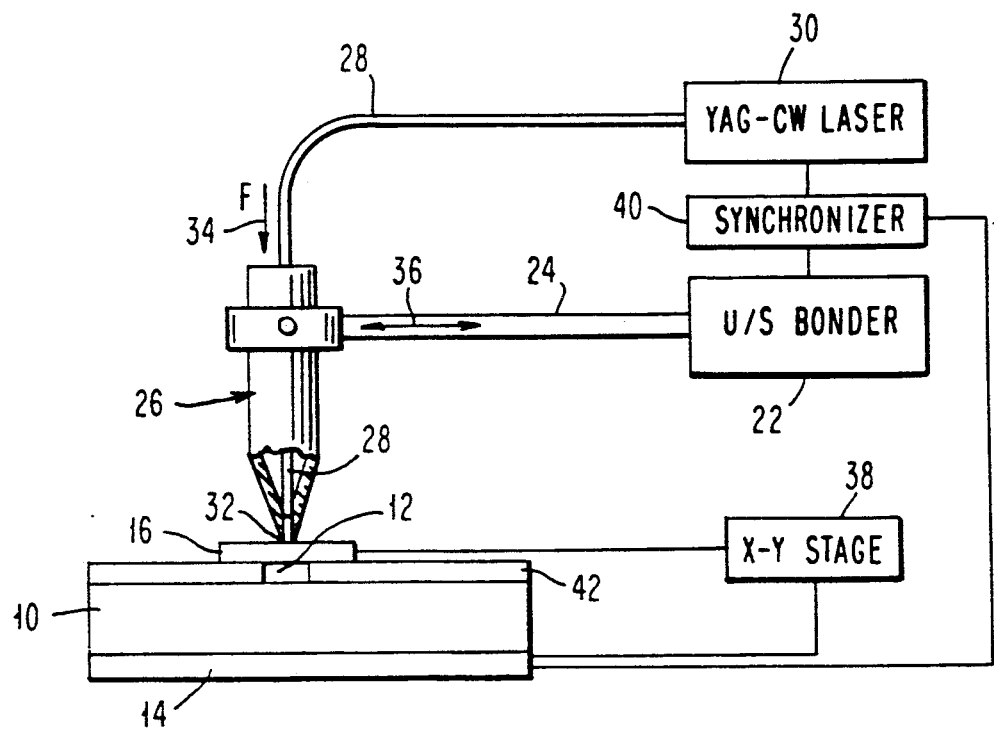
FIG. 1 is a schematic representation of a preferred apparatus useful for practicing the present invention.

Referring now to the figures and to FIG. 1 in particular, there is shown a schematic diagram (not to scale) of a preferred apparatus useful for practicing the present invention. A substrate 10 typically a printed circuit board or a multilayered ceramic substrate having an open defect 12 is disposed on an X-Y positioning stage 14. The printed circuit board can be rigid or it may be of a non-rigid form, such as an epoxy printed circuit board.

Figure 4:
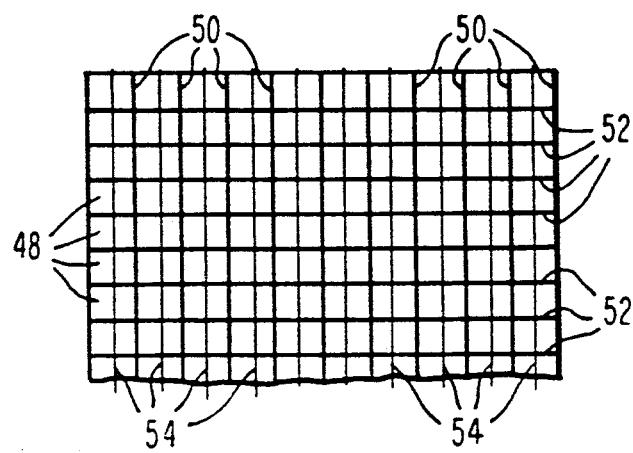
FIG. 4 is a plan view of an alternative embodiment of a support sheet.
Figure 2:
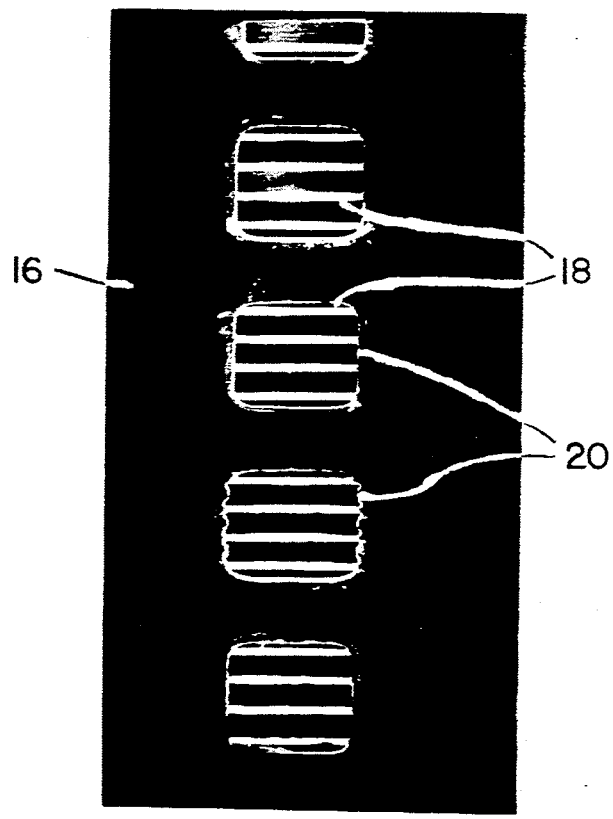
FIG. 2 is a plan view of repair lines on a support sheet.

FIG. 2 shows a support sheet 16, onto which a plurality of conductive repair lines or wires 18 have been etched. One or more conductive lines 18 are exposed as shown in FIG. 2 by etching window openings 20 into the sheet 16. In an alternative preferred embodiment shown in FIG. 4 the transfer sheet comprises a mesh having openings 48 formed by parallel support members 50 orthogonally coupled to parallel support members 52. A single conductive repair wire 54 is located across or spans each opening by being coupled to respective parallel members, for instance members 52, between the other parallel members 50, as shown. Depending upon the dimensions, more than one conductive line can be located in each opening. Also, the conductive lines can be of different dimensions.

The conductive lines are formed of substantially any metal which exhibits good electrical conductivity properties, an absence of corrosion, and is readily formed on a support sheet to form a grid. The preferred metal is gold-plated copper. However, the repair line segments can also be a noble metal, such as gold, and, in some instances, gold is the preferred metal. Alternatively, copper, gold plated-copper or even a combination of metals, such as gold-tin that form an eutectic alloy, can be used as the conductive line material. The conductive lines on the support sheet may be of the same or different dimensions.

The support sheet is fabricated using a material selected for the convenience of metallization and etching of the material used for the conductive lines. Preferred support sheet materials comprise polyimide or Kapton, which is blanket metallized by sputtered Cr/Cu, then circuitized by photoprocesses and etching procedures. Other organic or inorganic materials can also be used for the sheet. For example, Mylar and Teflon can be metallized for use as a support sheet. The support sheet can be metallized or laminated with a thin film metal layer. The support sheet can be a photosensitive polymer or epoxy or even a metal. For example, a thin layer (0.5 to 12 mil thick) of Ni metal can be coated with a 0.5 mil layer of gold. Another requirement of the support sheet is that it is capable of being etched to provide conductive lines which will become the repair segment. Using photoprocess and selective etching, the Ni can be etched to have window openings thereby exposing the gold lines to be used as repair segments.

The primary purpose of the support sheet is to provide mechanical support for the repair wire prior to and during bonding. It is the supported wire that is bonded across the open defect.

The thicknesses of the conductive lines and the support sheet are dependent upon the circuit conductor to be repaired. For instance, conventional printed circuit boards can require a repair segment approximately 2 mils wide and 0.5 mil thick. For more advanced devices, segments on the order of 0.5 mil wide and 0.5 mil thick segments are required. Correspondingly, the support sheet thickness preferably is approximately equal to the conductive repair line thickness.

The process for performing a repair is shown in FIG. 1 where a support sheet 16 with repair lines is disposed above the substrate 10. An ultrasonic welding apparatus or bonder 22 is coupled to a horn or resonator 24 for coupling reciprocating vibratory motion from the bonder 22 to a bonding tip 26. Also coupled to the tip 26 via an optical fiber 28 is a laser 30 for heating the frontal surface 32 of the tip 26 which will contact a repair line as will be described below.

In a preferred embodiment, the bonding tip 26 has an internal cylindrical cavity, approximately 0.75 to 1 mm in diameter ending in a conical shape at the frontal surface 32, where the diameter tapers down to a cylindrical opening in the frontal surface approximately 25 um in diameter and 100 um in length. In order to maximize coupling of the ultrasonic vibrating motion of the tip to the repair line, grooves or other surface roughening may be machined or etched in the frontal surface 32.

The laser energy is provided along optical fiber 28 into the tip 26. The diameter of the fiber 28 is approximately 200 mils. The laser energy is coupled from the fiber 28 into the cavity in the tip. The laser energy is reflected by and absorbed at the wall of the cavity thereby heating the frontal region and frontal surface 32 of the tip 26.

After the conductive repair wire and open defect are aligned, a lasersonic bonding apparatus for joining metal workpieces operates by applying a static force F in the direction of arrow 34 (i.e. in a direction normal to the conductor surface) for urging the repair wire into forced intimate contact with the conductor and simultaneously applying reciprocating vibratory motion via horn 24 to the tip 26 in the direction of double-headed arrow 36, i.e., in a direction normal to the direction of the applied force and parallel to the interface of the repair line and conductor to be repaired. While the tip undergoes the vibratory motion, laser energy is provided to the tip from laser 30 via fiber 28 for heating the tip as is known in the art and is described in pending patent application Ser. No. 07/489,838. Synchronizer 40 controls the timing and operation of bonder 22 and laser 30. After predetermined time intervals the laser energy and vibratory motion ceases and the static force is removed, at which time the repair line is joined to the ends of the open conductor.

Figure 3A:
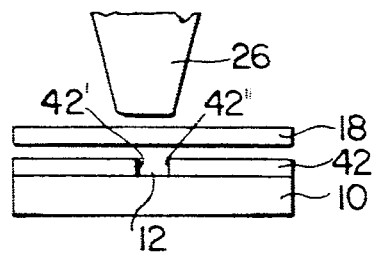
FIGS. 3A-3D are schematic representations of the steps for practicing the present invention.

The sequence of steps for repairing an open defect in a conductor is schematically illustrated in FIGS. 3A–3D. In FIG. 3A an open defect 12 in a conductor 42 located on substrate 10 is disposed on a first X-Y positioning stage 14 (FIG. 1). A support sheet containing conductive repair line 18 located in a window opening is coupled to a second X-Y positioning stage 38 (FIG. 1). The X-Y positioning stage 38 locates a selected repair line over the open defect 12 in the conductor 42.

The alignment of the repair line 18 and open defect 12 is achievable in several ways. In one method, the X-Y positioning stage 38 aligns the repair line 18 located on support sheet 16 over the defect 12 in the conductor 42 on substrate 10. The X-Y positioning stage 38 is mechanically coupled to X-Y positioning stage 14 in a manner as is known to one skilled in the art. Having located the repair line 18 in its proper position in relation to the open defect 12 on substrate 10, the X-Y positioning stage 14 coupled to X-Y positioning stage 38 locates the substrate 10 and the properly positioned repair line relative thereto under the tip 26 in the proper relative position for subsequent bonding. In an alternative method X-Y positioning stage 14 locates the open defect 12 in its proper position under the tip 26. Thereafter X-Y positioning stage 38 locates repair wire 18 in its proper position over the open defect 12 for subsequent bonding. In a still further alternative method, the repair wire 18 is located in position over open defect 12 by the motion of the X-Y positioning stage 14 or by the motion of X-Y position stage 38 or by a combination of the motion of the positioning stages. The bonder and specifically tip 26 then travels to a position over the repair line 18 and open defect 12 for bonding.

In practice, an operator using a microscope aligns the repair line in relation to the open defect and then aligns the combination of the repair line and open defect under the tip 26. Alternatively, a camera can be added to the microscope as is known in the art for displaying the image otherwise seen by the operator through the microscope onto a monitor. The open defect, repair line and welding tip can then be aligned while observing the monitor. The addition of a cross-hair or other indicator to the monitor further facilitates the alignment process. It is also possible to align the open defect, repair wire and welding tip by using a computer or microprocessor to control the x-y positioning stage 14, and/or the x-y positioning stage 38, and/or the position of the tip 26.

Figure 3B:
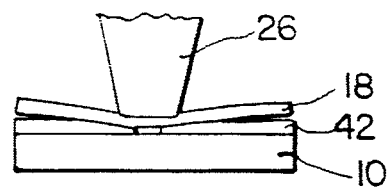

A repair line is selected having dimensions corresponding to the dimensions of the conductor containing the open defect. When the predetermined line is properly aligned over the open defect in the X-Y plane of the substrate as described above, a Z-axis controller (not shown) places the repair wire in juxtaposition with the open conductor as shown in FIG. 3A. As shown in FIG. 3B, with the line 18 in proper alignment and located under the welding tip 26, the tip 26 of ultrasonic horn 24 is urged into intimate contact with line 18 supported on support sheet 16 by the application of a force F in the direction of arrow 34 causing the line 18 to be in forced intimate contact with the open ends 42' and 42" of conductor 42. The ultrasonic bonder 22 is then activated for causing tip 26 to undergo reciprocating vibratory motion at an ultrasonic frequency in the direction of double-headed arrow 36, i.e. in a direction substantially normal to the direction of the applied force F. While the tip undergoes vibratory motion, synchronizer 40 activates laser 30 for providing laser energy to the tip 26 via fiber 28 for heating the tip as is known in the art and is described in aforementioned pending patent application Ser. No. 07/489,838.

The ultrasonic vibratory motion aids the line 18 in penetrating any thin contamination or metallic film such as a chromium layer, usually 400 Angstroms thick, that coats the surface of conductor 42 while the laser energy heats the tip for providing the thermal energy required to form a diffusion bond of the line 18 in the region of open defect 12 in proximity to the ends 42' and 42" of the conductor 42.

Figure 3C:
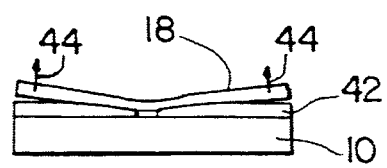
Figure 3D:
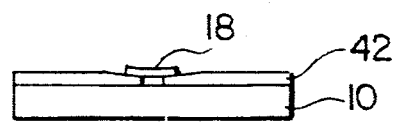

Following the bonding, both the ultrasonic energy and laser energy cease and the tip is removed from the conductive line leaving the line 18 on sheet 16 bonded to conductor 42 as shown in FIG. 3C. The support sheet 16 is then lifted from substrate 10 in the general direction indicated by arrows 44. The peeling action of the support sheet applies both a tensile force to the bonded repair line and a peeling force to the bond area between the line and the conductor. A good repair is obtained when the strength of the bond area exceeds the strength of the line and the line breaks leaving a bonded patch over the defect as shown in FIG. 3D. Thus, the peeling step provides an in-process adhesion test for determining the existence of a sound metallurgical bond.

The variables affecting the bonding process are the laser power, bonding time, bonding force F and ultrasonic energy. Each or any of these variables are adjusted to meet the particular repair problem encountered, such as the materials to be bonded, width and thickness of the elements to be bonded, and length of the open defect to be repaired. The nominal values used in feasibility studies which yielded satisfactory results were laser power—13 watts, bonding time—50 msec, bonding force—50 g and ultrasonic energy—200 milliwatts. The preferred range of values for each of the variables are laser power in the range between 13 and 18 watts, bonding time in the range between 30 and 100 msec, bonding force in the range between 40 and 60 g and ultrasonic energy in the range up to and including 600 milliwatts.

As will be apparent to those skilled in the art, the present invention provides a fast and simple method of repairing open defects in conductors by bonding a patch without the need for surface preparation, such as the removal of a thin film from the conductor, or additional steps after bonding, such as wet removal of excess material. It is estimated that a repair thruput rate of 1 sec/repair can be easily accomplished when one considers that industrial systems used in wire bonding are capable of achieving 10 bonds/sec. Superior reliability of repair results from the mettallurgical bond and the fact that the wire material is inherently low itself in structural defect.

While there has been described and illustrated a preferred method of repairing open defects in conductor lines on a substrate, it will be apparent to those skilled in the art that modifications and variations are possible without deviating from the broad principles of the invention which shall be limited solely by the scope of the claims appended hereto.

What is claimed is:

1. A support sheet for use in repairing an open defect in a conductor on a substrate comprising:
    a sheet of material; and
    a pattern of conductive lines disposed on said sheet, said sheet having openings at predetermined regions in proximity to said lines.

2. A support sheet as set forth in claim 1, wherein said material is selected from the group consisting of polyimide, Kapton, Mylar, Teflon, Ni metal, and photosensitive polymer.

3. A support sheet as set forth in claim 2, wherein said conductive line is selected from the group consisting of copper, noble metal, gold-plated copper and a combination of metals that form an eutectic alloy.

4. A support sheet as set forth in claim 2, wherein the lines comprising said pattern have a plurality of dimensions.

5. A support sheet as set forth in claim 1, wherein said conductive line is selected from the group consisting of copper, noble metal, gold-plated copper and a combination of metals that form an eutectic alloy.

6. A support sheet as set forth in claim 1 wherein the lines comprising said pattern of conductive lines have a plurality of dimensions.

7. A support sheet comprising:
    a mesh of openings formed of a first plurality of parallel supports substantially orthogonally intersecting a second plurality of parallel supports; and
    a conductive line supported by a respective pair of parallel supports across an opening.

8. A method of repairing an open defect in a conductor on a substrate comprising the steps of:
    aligning a selected conductive repair line, disposed on support means containing a plurality of repair lines, in juxtaposition with an open defect in a conductor on a substrate;

bonding the selected line to said open conductor by the combined application of ultrasonic energy and laser energy; and removing the support means from the substrate after the repair line is bonded to the conductor.

9. A method as set forth in claim 8, wherein said support means comprises material selected for the convenience of fabricating repair lines thereon.

10. A method as set forth in claim 9, wherein said support means material is selected from the group consisting of polyimide, Kapton, Mylar, Teflon, Ni metal, and photosensitive polymer.

11. A method as set forth in claim 8, wherein said substrate is a multi-layered ceramic substrate.

12. A method as set forth in claim 8, wherein said substrate is a non-rigid organic substrate.

13. A conductor on a substrate having an open defect repaired in accordance with the method set forth in claim 8.

14. A method of fabricating a support sheet for use in repairing an open defect in a conductor on a substrate comprising the steps of:

providing a sheet of material;

disposing a pattern of conductive lines onto said sheet; and creating window openings into predetermined regions of said sheet at locations in proximity to the conductive lines.

15. A method as set forth in claim 14, wherein said disposing a pattern of conductive lines is performed by circuitization.

16. A method as set forth in claim 14, wherein said providing a sheet comprises providing a sheet selected from the group consisting of polyimide, Kapton, Mylar, Teflon, Ni metal, and photosensitive polymer.

17. A method as set forth in claim 14, wherein said disposing a pattern of conductive lines comprises circuitizing metal lines selected from the group consisting of copper, noble metal, gold-plated copper and a combination of metals that form an eutectic alloy.

18. A support sheet fabricated in accordance with the method as set forth in claim 14.

19. A support sheet fabricated in accordance with the method as set forth in claim 15.

20. A support sheet fabricated in accordance with the method as set forth in claim 16.

21. A support sheet fabricated in accordance with the method as set forth in claim 17.

* * * * *